United States Patent
Jung et al.

(10) Patent No.: US 8,208,085 B2
(45) Date of Patent: Jun. 26, 2012

(54) LIQUID CRYSTAL DISPLAY DEVICE AND FABRICATION METHOD THEREOF

(75) Inventors: Ji-Hyun Jung, Gyeongsangbuk-Do (KR); Hyun-Seok Hong, Gyeonggi-Do (KR); Byoung-Ho Lim, Gyeongsangbuk-Do (KR)

(73) Assignee: LG Display Co., Ltd., Seoul (KR)

( * ) Notice: Subject to any disclaimer, the term of this patent is extended or adjusted under 35 U.S.C. 154(b) by 795 days.

(21) Appl. No.: 12/003,648

(22) Filed: Dec. 28, 2007

(65) Prior Publication Data

US 2008/0174711 A1 Jul. 24, 2008

(30) Foreign Application Priority Data

Dec. 29, 2006 (KR) .................. 10-2006-0139116

(51) Int. Cl.
*G02F 1/136* (2006.01)
(52) U.S. Cl. ......................................................... 349/43
(58) Field of Classification Search .................. None
See application file for complete search history.

(56) References Cited

U.S. PATENT DOCUMENTS

| | | | | |
|---|---|---|---|---|
| 7,911,551 B2* | 3/2011 | Jung et al. | | 349/43 |
| 2002/0117691 A1* | 8/2002 | Choi et al. | | 257/225 |
| 2004/0263757 A1* | 12/2004 | Kwon | | 349/149 |
| 2006/0139504 A1* | 6/2006 | Ahn et al. | | 349/42 |
| 2008/0122767 A1* | 5/2008 | Lim et al. | | 345/87 |

FOREIGN PATENT DOCUMENTS

| | | | |
|---|---|---|---|
| JP | 2002-090779 | | 3/2002 |
| JP | 2002-110631 | | 4/2002 |
| JP | 2002110631 A | * | 4/2002 |
| KR | 10-0219480 | | 6/1999 |
| KR | 2000-0010168 | | 2/2000 |
| KR | 2002-0095997 | | 12/2002 |

\* cited by examiner

*Primary Examiner* — Thanh-Nhan P. Nguyen
(74) *Attorney, Agent, or Firm* — Morgan, Lewis & Bockius LLP

(57) ABSTRACT

A liquid crystal display (LCD) device includes: a first substrate divided into a pixel part and first and second pad parts; a gate electrode and a gate line formed at the pixel part of the first substrate; an active pattern as an island formed over the gate electrode with a first insulation film interposed therebetween, and having a width smaller than the gate electrode; an ohmic-contact layer formed on source and drain regions of the active pattern on the first substrate; source and drain electrodes formed as islands over the gate electrode of the first substrate and electrically connected with the source and drain regions of the active pattern via the ohmic-contact layer; a data line formed on the pixel part of the first substrate and crossing the gate line to define a pixel region; a pixel electrode formed at the pixel region and electrically connected with the drain electrode; a second insulation film formed on the first substrate; and a second substrate attached to the first substrate in a facing manner.

17 Claims, 16 Drawing Sheets

LIQUID CRYSTAL DISPLAY DEVICE AND FABRICATION METHOD THEREOF

BACKGROUND OF THE INVENTION

1. Field of the Invention

Embodiments of the present invention relate to a display device and, more particularly, to a liquid crystal display (LCD) device and a fabrication method thereof. Although embodiments of invention are suitable for a wide scope of applications, it is particularly suitable for simplifying a fabrication process and improving a production yield by reducing the number of masks by using a two-metal stacked structure and also suitable for forming a forward taper shape in the two-metal stacked structure.

2. Description of the Related Art

As the consumer's interest in information displays is growing and the demand for portable (mobile) information devices is increasing, research and commercialization of light and thin flat panel displays ("FPD") has increased.

Among FPDs, the liquid crystal display ("LCD") is a device for displaying images by using optical anisotropy of liquid crystal. LCD devices exhibit excellent resolution and color and picture quality, so it is widely used for notebook computers or desktop monitors, and the like.

The LCD includes a color filter substrate, an array substrate and a liquid crystal layer formed between the color filter substrate and the array substrate.

An active matrix (AM) driving method commonly used for the LCD is a method in which liquid crystal molecules in a pixel part are driven by using amorphous silicon thin film transistors (a-Si TFTs) as switching elements.

In the fabricating process, of the LCD, a plurality of masking processes (namely, photographing processes) are basically performed to fabricate the array substrate including the TFTs, so a method for reducing the number of masking process will increase productivity.

The general structure of the LCD will now be described in detail with reference to FIG. 1.

FIG. 1 is an exploded perspective view showing a general LCD.

As shown in FIG. 1, the LCD includes a color filter substrate 5, an array substrate 10 and a liquid crystal layer 30 formed between the color filter substrate 5 and the array substrate 10.

The color filter substrate 5 includes a color filter (C) including a plurality of sub-color filters 7 that implement red, green and blue colors, a black matrix 6 for dividing the sub-color filters 7 and blocking light transmission through the liquid crystal layer 30, and a transparent common electrode 8 for applying voltage to the liquid crystal layer 30.

The array substrate 10 includes gate lines 16 and data lines 17 which are arranged vertically and horizontally to define a plurality of pixel regions (P), TFTs, switching elements, formed at respective crossings of the gate lines 16 and the data lines 17, and pixel electrodes 18 formed on the pixel regions (P).

The color filter substrate 5 and the array substrate 10 are attached in a facing manner by a sealant (not shown) formed at an edge of an image display region to form a liquid crystal panel, and the attachment of the color filter substrates 5 and the array substrate 10 is made by an attachment key formed on the color filter substrate 5 or the array substrate 10.

FIGS. 2A to 2E are cross-sectional views sequentially showing a fabrication process of the array substrate of the LCD in FIG. 1.

As shown in FIG. 2A, a gate electrode 21 made of a conductive material is formed by using a photolithography process (a first masking process) on a substrate.

Next, as shown in 2B, a first insulation film 15a, an amorphous silicon thin film and an n+ amorphous silicon thin film are sequentially deposited over the entire surface of the substrate 10 with the gate electrode 21 formed thereon, and the amorphous silicon thin film and the n+ amorphous silicon thin film are selectively patterned by using the photolithography process (a second masking process) to form an active pattern 24 formed of the amorphous silicon thin film on the gate electrode 21.

In this case, the n+ amorphous silicon thin film pattern 25 which has been patterned in the same form as the active pattern 24 is formed on the active pattern 24.

Thereafter, as shown in FIG. 2C, a conductive metal material is deposited over the entire surface of the array substrate 10 and then selectively patterned by using the photolithography process (a third masking process) to form a source electrode 22 and a drain electrode 23 at an upper portion of the active pattern 24. At this time, a certain portion of the n+ amorphous silicon thin film pattern formed on the active pattern 24 is removed through the third masking process to form an ohmic-contact layer 25' between the active pattern 24 and the source and drain electrodes 22 and 23.

Subsequently, as shown in FIG. 2D, a second insulation film 15b is deposited over the entire surface of the array substrate 10 with the source electrode 22 and the drain electrode 23 formed thereon, and a portion of the second insulation film 15b is removed through the photolithography process (a fourth masking process) to form a contact hole 40 exposing a portion of the drain electrode 23.

As shown in FIG. 2E, a transparent conductive metal material is deposited over the entire surface of the array substrate 10 and then selectively patterned by using the photolithography process (a fifth making process) to form a pixel electrode 18 electrically connected with the drain electrode 23 via the contact hole 40.

As mentioned above, in fabricating the array substrate including TFTs, according to the related art, a total of five photolithography processes are necessarily performed to pattern the gate electrode, the active pattern, the source and drain electrodes, the contact hole and the pixel electrode.

A photolithography process is a process of transferring a pattern formed on a mask onto the substrate on which a thin film is deposited to form a desired pattern, which includes a plurality of processes such as a process of coating a photosensitive solution, an exposing process and a developing process, etc., which degrade the production yield.

In particular, because the masks designed for forming the pattern are quite expensive, as the number of masks used in the processes increases, the fabrication cost of the LCD increases proportionally.

A technique for fabricating the array substrate by performing the masking process four times by forming the active pattern and the source and drain electrodes using a single masking process having a slit (diffraction) mask has been proposed.

However, because the active pattern, the source and drain electrodes and the data lines are simultaneously patterned by performing an etching process twice, the active pattern protrusively remains near the lower portions of the source electrode, the drain electrode and the data lines.

The protrusively remaining active pattern is formed of an intrinsic amorphous silicon thin film, so the protrusively remaining active pattern is exposed to light from the lower backlight, generating an optical current. The amorphous silicon thin film reacts slightly to a blinking of the light from the back light, and repeatedly becomes activated and deactivated, which causes a change in the optical current. The changing optical current component is coupled with a signal flowing in the neighboring pixel electrodes so as to distort movement of the liquid crystal molecules positioned at the pixel electrodes. As a result, a wavy noise is generated such that a wavy fine line appears on a screen of the LCD.

In addition, because the active pattern positioned at the lower portion of the data lines has portions that protrude at a certain height from both sides of the data lines, the opening region of the pixel part is encroached by as much as the protrusion height, thus resulting in a reduction in an aperture ratio of the LCD.

SUMMARY OF THE INVENTION

Accordingly, embodiments of the invention are directed to a liquid crystal display (LCD) and its fabrication method that substantially obviate one or more of the problems due to limitations and disadvantages of the related art.

An object of the embodiments of the invention is to provide a liquid crystal display (LCD) and its fabrication method capable of fabricating an array substrate by performing a masking process four times by using a two-metal stacked structure.

Another object of the embodiments of the invention is to provide an LCD and its fabrication method capable of implementing high picture quality without generating a wavy noise, and capable of implementing high luminance by extending an opening region.

Still another object of the embodiments of the invention is to provide an LCD having a forward taper shape and being capable of preventing an undercut phenomenon in a two-metal stacked structure.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims thereof as well as the appended drawings.

To achieve these and other advantages and in accordance with the purpose of embodiments of the invention, as embodied and broadly described, a liquid crystal display (LCD) device includes: a first substrate divided into a pixel part and first and second pad parts; a gate electrode and a gate line formed at the pixel part of the first substrate; an active pattern as an island formed over the gate electrode with a first insulation film interposed therebetween, and having a width smaller than the gate electrode; an ohmic-contact layer formed on source and drain regions of the active pattern on the first substrate; source and drain electrodes formed as islands over the gate electrode of the first substrate and electrically connected with the source and drain regions of the active pattern via the ohmic-contact layer; a data line formed on the pixel part of the first substrate and crossing the gate line to define a pixel region; a pixel electrode formed at the pixel region and electrically connected with the drain electrode; a second insulation film formed on the first substrate; and a second substrate attached to the first substrate in a facing manner.

To achieve these and other advantages and in accordance with the purpose of embodiments of the invention, as embodied and broadly described, a method for fabricating an LCD includes: providing a first substrate divided into a pixel part and first and second pad parts; forming a gate electrode and a gate line at the pixel part of the first substrate; forming an active pattern as an island over the gate electrode and forming a data line crossing the gate line to define a pixel region at the pixel part of the first substrate; forming source and drain electrodes at the pixel part of the first substrate and forming a pixel electrode at the pixel region; forming source and drain electrode patterns formed at upper portions of the source and drain electrodes and having a forward taper shape; forming a second insulation film on the first substrate; and attaching the first substrate and a second substrate.

To achieve these and other advantages and in accordance with the purpose of embodiments of the invention, as embodied and broadly described, a method for fabricating two-metal stacked structure, includes: forming first and second conductive film on a substrate; forming a first photosensitive film pattern on the substrate; selectively removing the second conductive film by using the first photosensitive film pattern as a mask to form a second conductive film pattern; collapsing the first photosensitive film pattern through a baking process to form a second photosensitive film pattern covering the second conductive film pattern; and selectively removing the first conductive film by using the second photosensitive film pattern as a mask to form a first conductive film pattern having a width larger than the second conductive film pattern.

It is to be understood that both the foregoing general description and the following detailed description are exemplary and explanatory and are intended to provide further explanation of embodiments as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

The liquid crystal display (LCD) and its fabrication method will now be described in detail with reference to the accompanying drawings.

Figure 1:
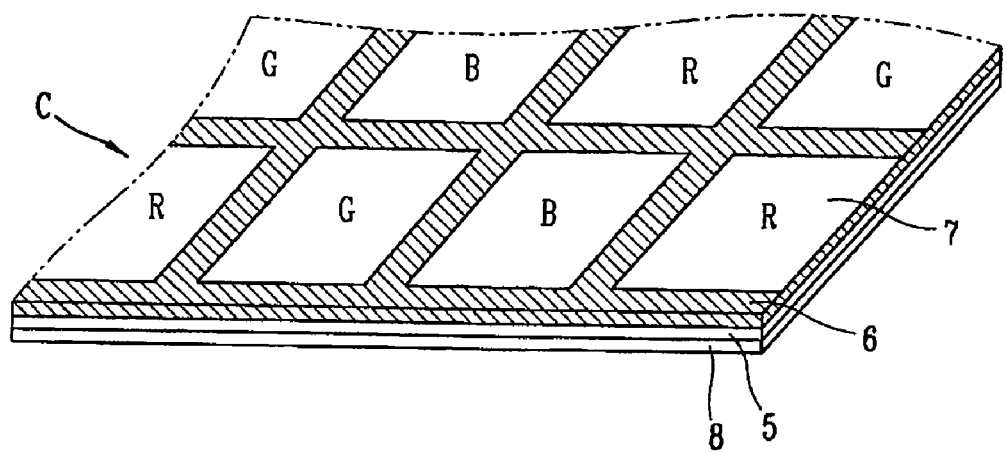
FIG. 1 is an exploded perspective view showing a general liquid crystal display (LCD)
Figure 1:
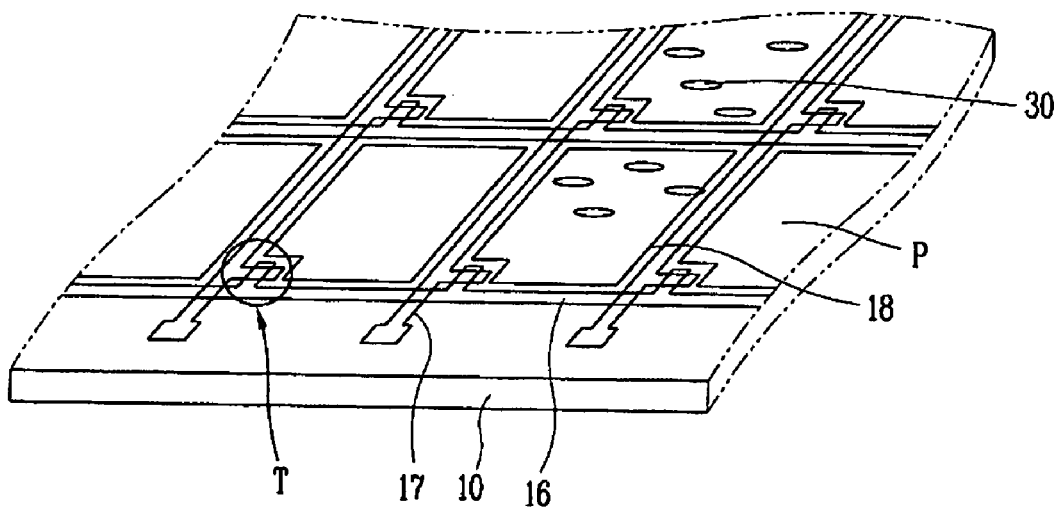
Figure 2A:
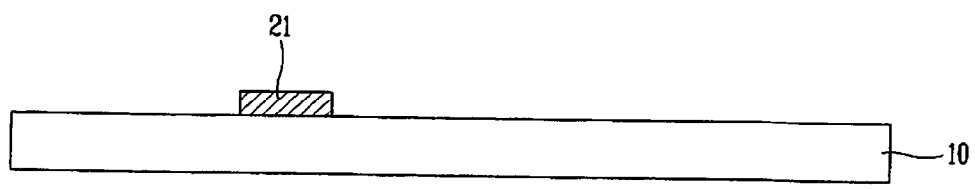
FIGS. 2A to 2E are cross-sectional views sequentially showing a fabrication process of an array substrate of the LCD in FIG. 1.
Figure 2B:
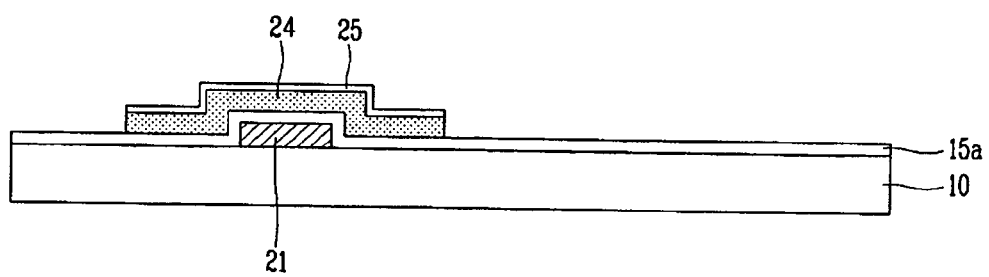
Figure 2C:
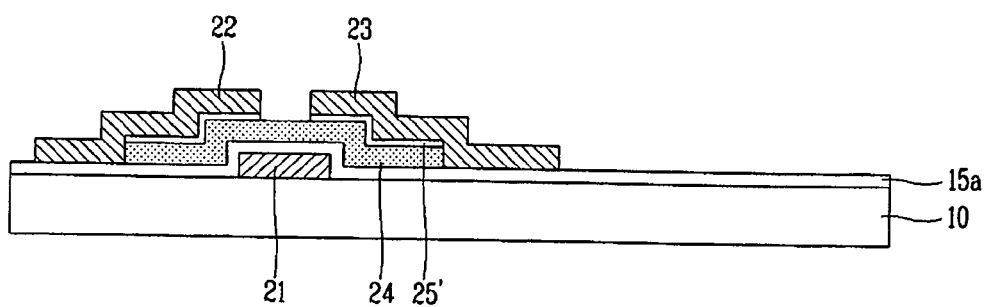
Figure 2D:
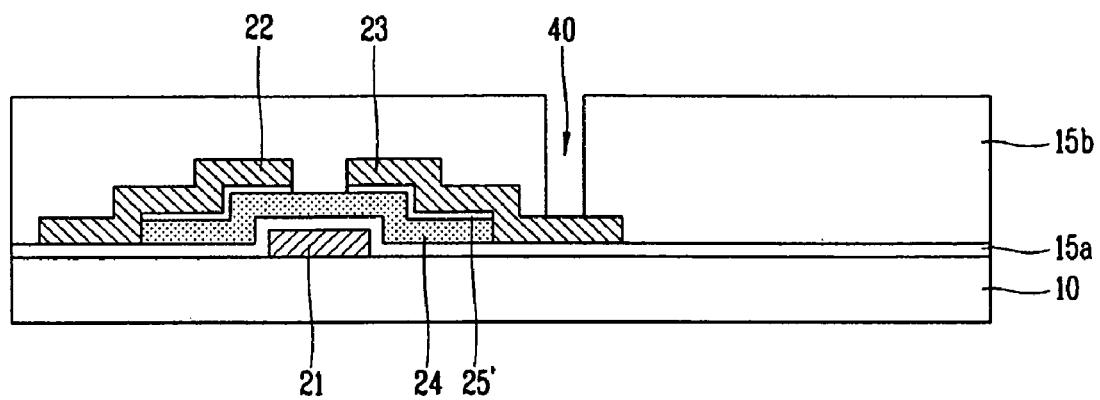
Figure 2E:
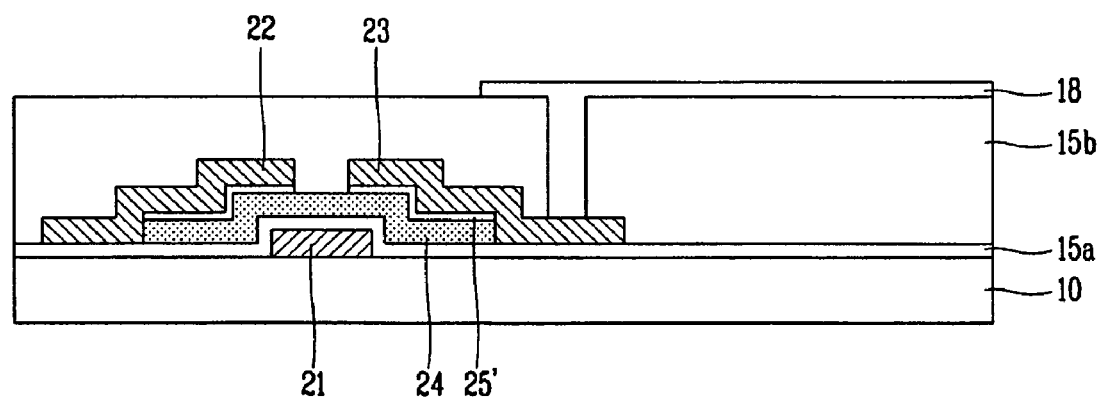
Figure 3:
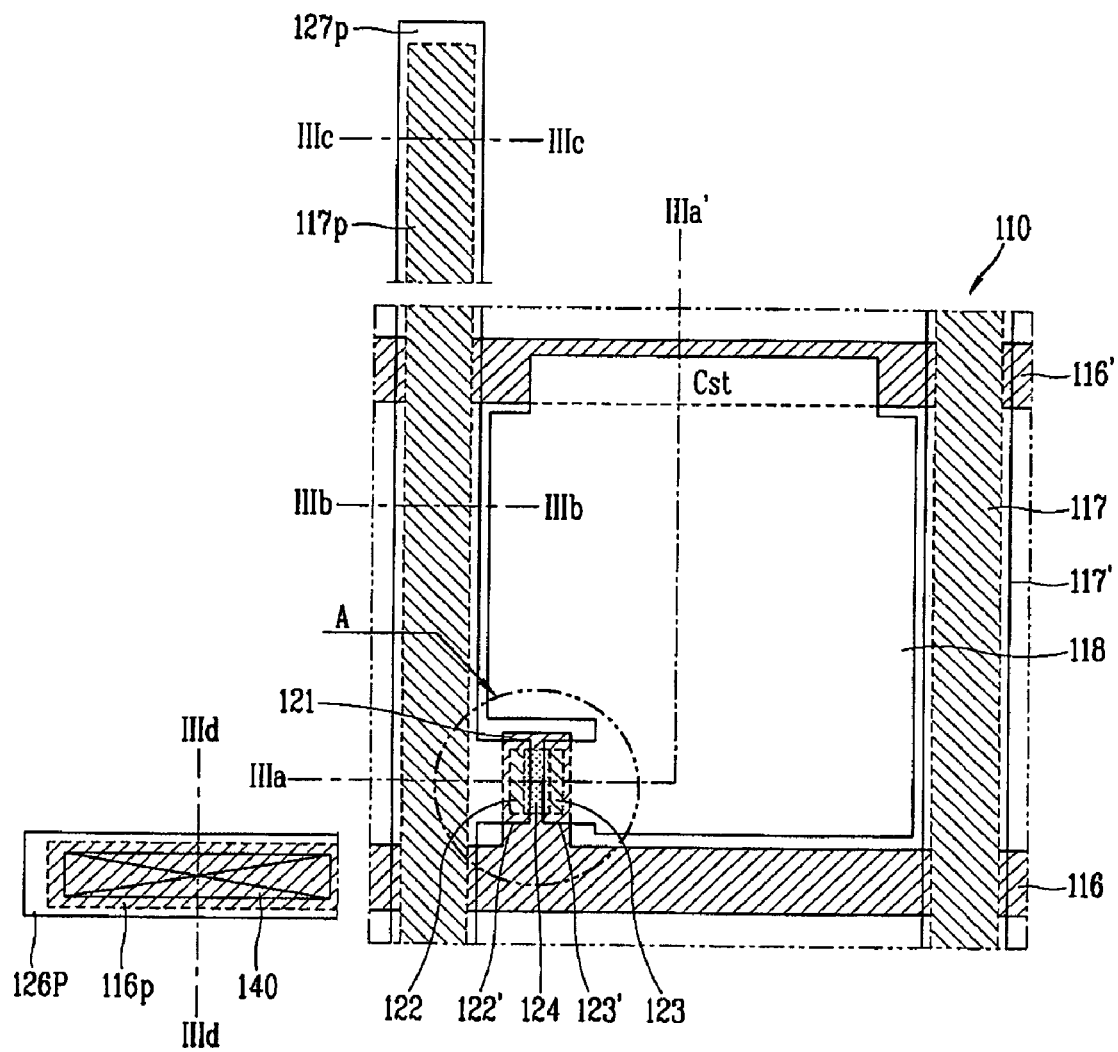
FIG. 3 is a plan view showing a portion of an array substrate of an LCD according to a first embodiment of the present invention.

FIG. 3 is a plan view showing a portion of an array substrate of an LCD according to a first embodiment of the present invention, in which a single pixel including a gate pad part and a data pad part are shown for the sake of explanation.

Figure 4:
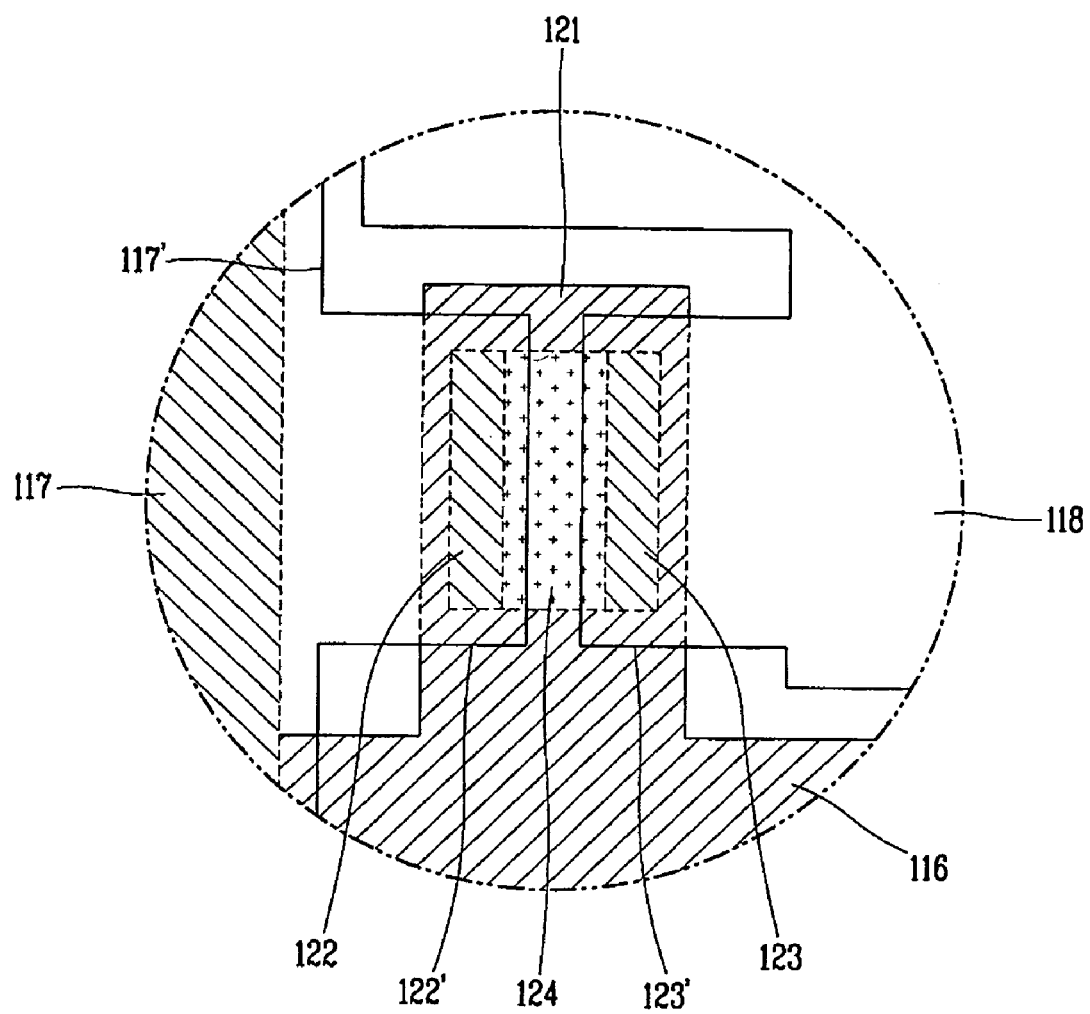
FIG. 4 is a view illustrating an enlarged portion 'A' of the array substrate in FIG. 3.

FIG. 4 is a view illustrating an enlarged portion 'A' of the array substrate in FIG. 3.

Actually, the N number of gate lines and the M number of data lines are formed to cross each other to define the M×N number of pixels. To simplify the explanation, only a single pixel is shown.

As shown in FIGS. 3 and 4, on an array substrate 110 according to a first embodiment of the present invention, gate lines 116 and the data lines are formed to be arranged vertically and horizontally to define the pixel region. A thin film transistor (TFT), a switching element, is formed at a crossing of the gate line 116 and the data line 117. A pixel electrode 118 is formed within the pixel region, is connected with the TFT to drive liquid crystal (not shown) together with a common electrode of a color filter substrate (not shown).

A gate pad electrode 126p and a data pad electrode 127p are formed at edge portions of the array substrate 110 and electrically connected with the gate line 116 and the data line 117, and transfer a scan signal and a data signal applied from an external driving circuit unit (not shown) to the gate line 116 and the data line 117, respectively.

Namely, the gate line 116 and the data line 117 extend to the driving circuit unit so as to be connected with the corresponding gate pad line 116p and the data pad line 117p, and the gate pad line 116p and the data pad line 117p receive the scan signal and the data signal from a driving circuit unit through the gate pad electrode 126p and the data pad electrode 127p electrically connected with the gate pad line 116p and the data pad line 117p.

The gate pad electrode 126p is electrically connected with the gate pad line 117p via the gate pad part contact hole 140.

The TFT includes a gate electrode 121 connected with the gate line 116, a source electrode 122 connected with the data line 117, and a drain electrode 123 connected with the pixel electrode 118. The TFT also includes an active pattern 124 for forming a conductive channel between the source and drain electrodes 122 and 123 by a gate voltage supplied to the gate electrode 121.

In the embodiment of the present invention, the active pattern 124 is formed of an amorphous silicon thin film, and is formed as an island at an upper portion of the gate electrode 121 to thus reduce an off current of the TFT.

At an upper portion of the source electrode 122, the drain electrode 123 and the data line 117 made of an opaque conductive material, there are formed a source electrode pattern 122', a drain electrode pattern 123' and a data line pattern 117' made of a transparent conductive material and patterned to have a width larger than the source electrode 122, the drain electrode 123 and the data line 117.

The source and drain electrode 122 and 123 according to the first embodiment of the present invention are formed as islands over the gate electrode 121 and within boundaries defined by the perimeter of the gate electrode 121, and in this case, the source electrode 122 is electrically connected with the data line 117 via the source electrode pattern 122' and the drain electrode 123 is electrically connected with the pixel electrode 118 via the drain electrode pattern 123'.

In the first embodiment of the present invention, the source electrode 122, the drain electrode 123, and the data line 117 are completely covered by the source electrode pattern 122', the drain electrode pattern 123' and the data line pattern 117' that are formed thereon without any exposed portions.

A portion of the previous gate line 116' overlaps with a portion of the pixel electrode 118 with a first insulation film (not shown) interposed therebetween to form a storage capacitor Cst. The storage capacitor Cst serves to uniformly maintain voltage applied to a liquid crystal capacitor until a next signal is received. Namely, the pixel electrode 118 of the array substrate 110 forms the liquid crystal capacitor together with the common electrode of the color filter substrate, and in general, voltage applied to the liquid crystal capacitor is not maintained until the next signal is received but leaked. Thus, in order to uniformly maintain the applied voltage, the storage capacitor Cst should be connected with the liquid crystal capacitor.

Besides maintaining the signal, the storage capacitor may also have the effects of stabilizing a gray scale display, reducing flickering effects, reducing the formation of residual images, and the like.

Herein, the active pattern 124 and the data line 117 are formed through a single masking process by using a half-tone mask or a diffraction (slit) mask (when the half-tone mask is mentioned, it also means that the slit mask is included). The source and drain electrodes 122 and 123, the pixel electrode 118, and the pad part electrodes 126p and 127p are simultaneously formed through a single masking processing by using a two-metal stacked structure. This will now be described through the method for fabricating the LCD as follows.

FIGS. 5A to 5D are cross-sectional views sequentially showing a fabrication process taken along lines IIIa-IIIa', IIIb-IIIb, IIIc-IIIc and IIId-IIId of the array substrate in FIG. 3. The left side shows the process of fabricating the array substrate of the pixel part including the data line part and the right side shows the sequential process of fabricating the array substrate of the data pad part and the gate pad part.

Figure 6A:
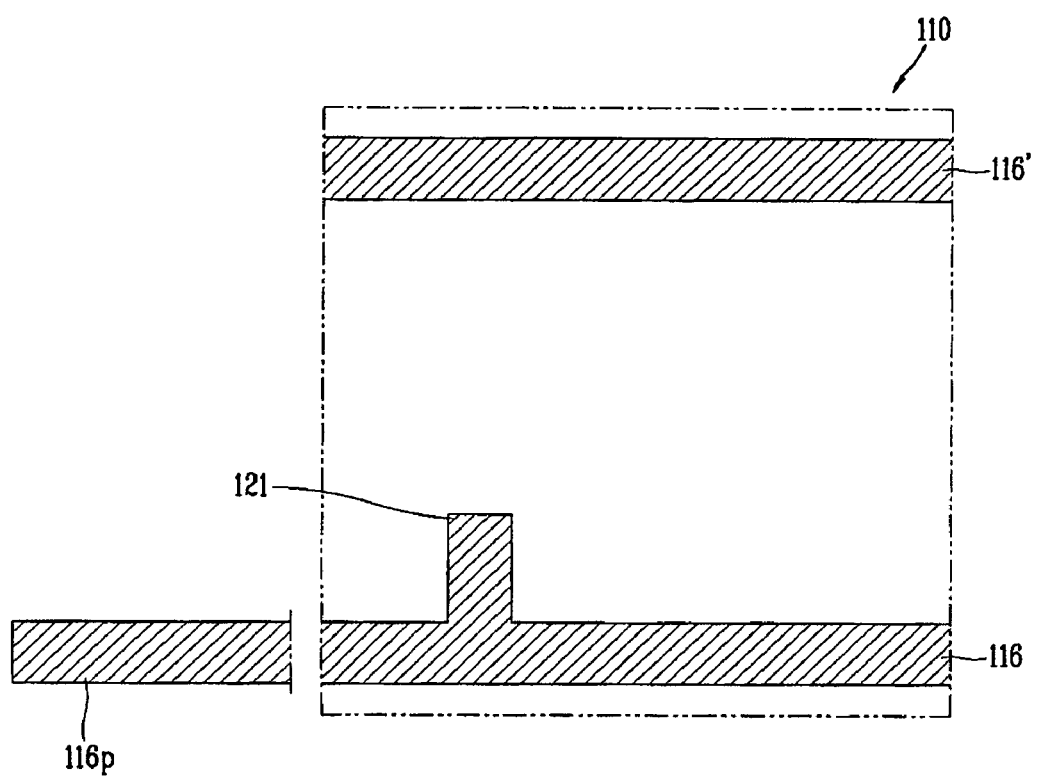
FIGS. 6A to 6C are plan views sequentially showing the fabrication process of the array substrate in FIG. 3.
Figure 6B:
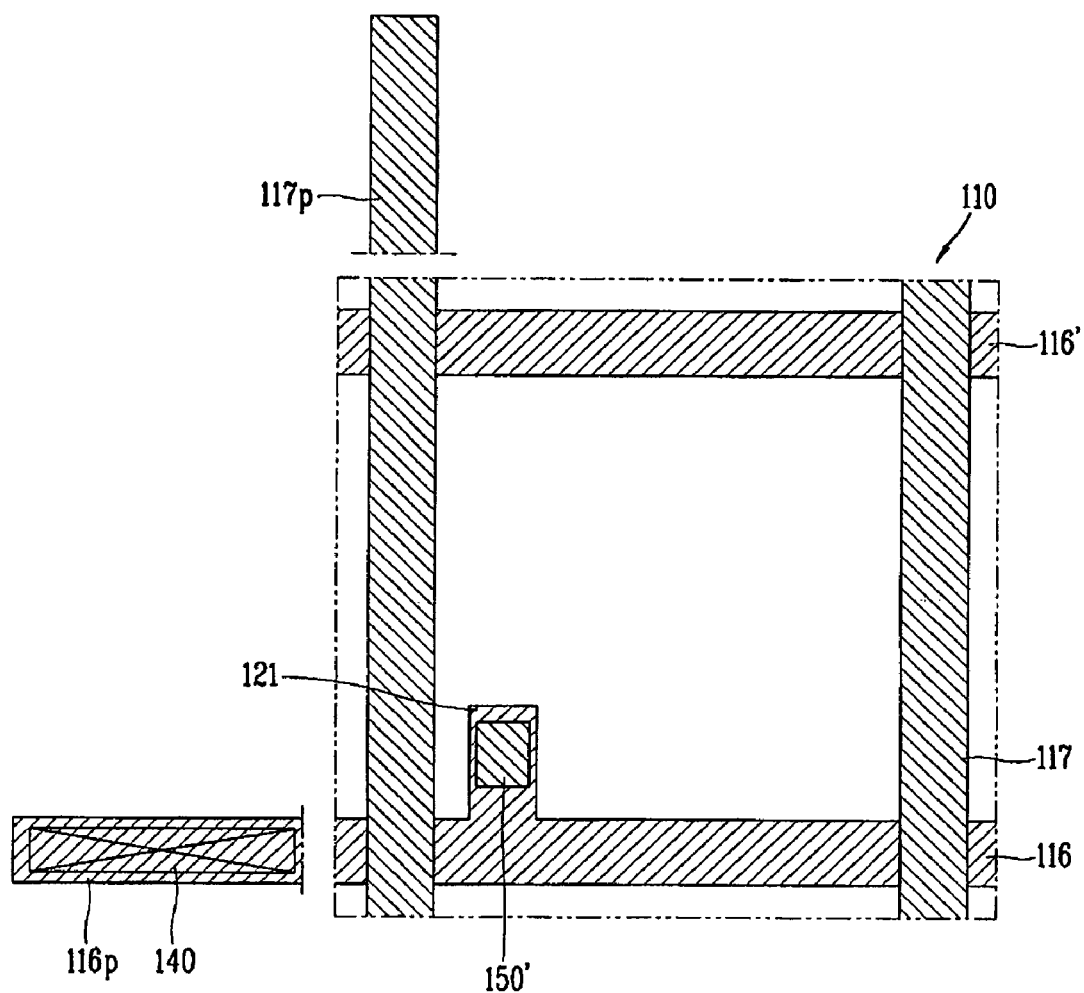
Figure 6C:
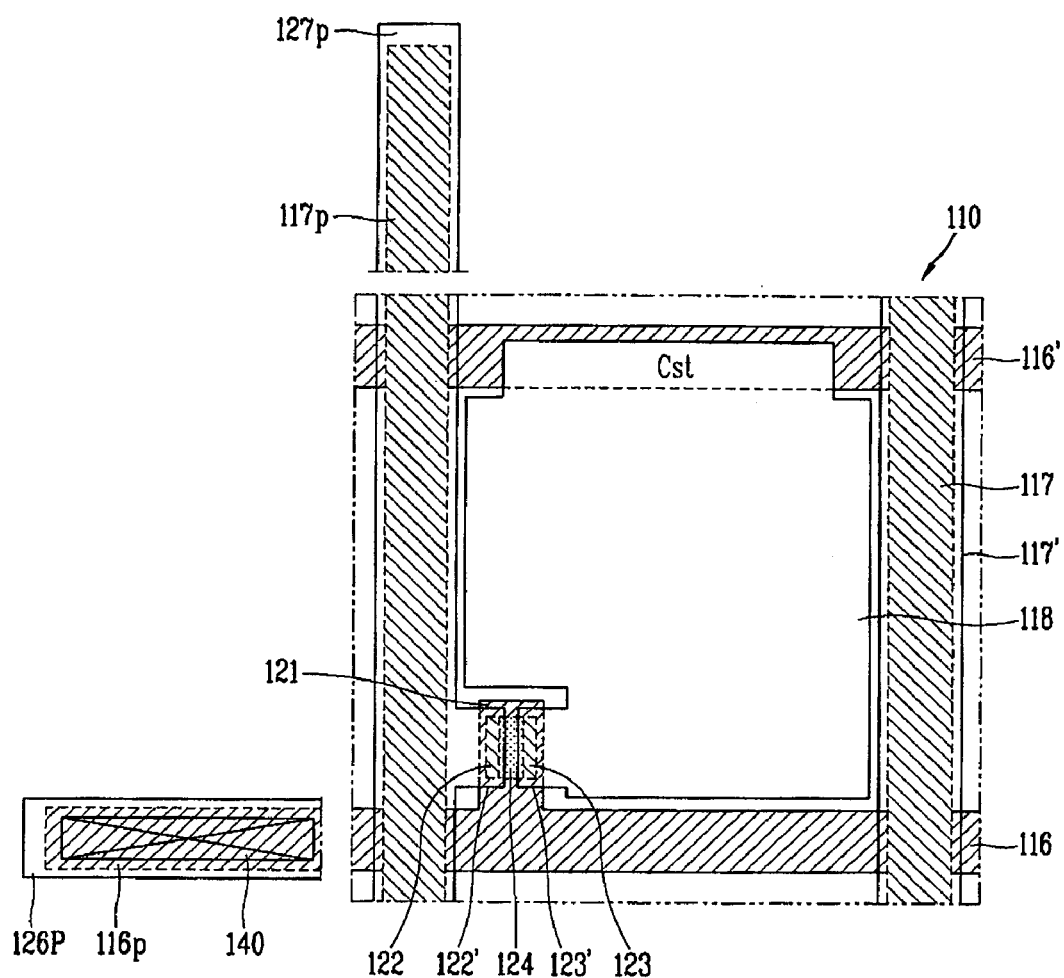

FIGS. 6A to 6C are plan views sequentially showing the fabrication process of the array substrate in FIG. 3.

Figure 5A:
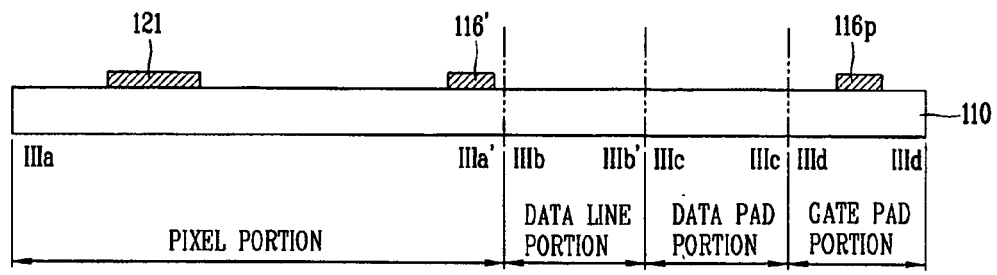
FIGS. 5A to 5D are cross-sectional views sequentially showing a fabrication process taken along lines IIIa-IIIa', IIIb-IIIb, IIIc-IIIc and IIId-IIId of the array substrate in FIG. 3.

As shown in FIGS. 5A and 6A, the gate electrode 121 and gate lines 116 and 116' on the pixel part of the array substrate 110 made of the transparent insulation material such as glass, and the gate pad line 116p is formed on the gate pad part of the array substrate 110.

Reference numeral 116' refers to the previous gate line with respect to a corresponding pixel, and the gate line 116 of the corresponding pixel and the previous gate line 116' are formed in the same manner.

In this case, the gate electrode 121, the gate lines 116 and 116' and the gate pad line 116p are formed by depositing a first conductive film over the entire surface of the array substrate 110 and selectively patterning it through the photolithography process (the first masking process).

Herein, the first conductive film can be made of a low-resistance opaque conductive material such as aluminum (Al), an aluminum alloy, tungsten (W), copper (Cu), chromium (Cr) and molybdenum (Mo), or the like. Also, the first conductive film can be formed with a multi-layered structure by stacking two or more low-resistance conductive materials.

Figure 5B:
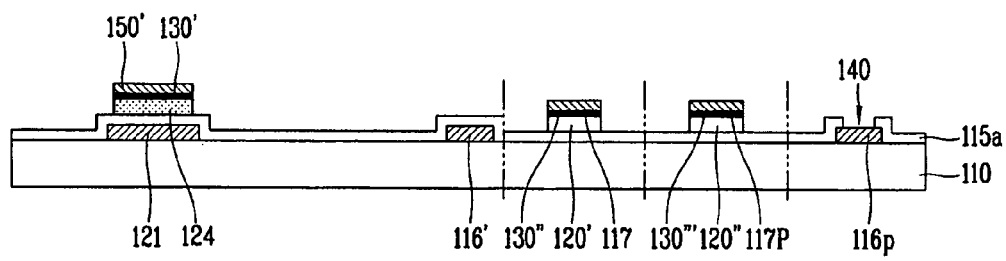

Next, as shown in FIGS. 5B and 6B, a first insulation film 115a, an amorphous silicon thin film, an n+ amorphous silicon thin film and a second conductive film are formed over the entire surface of the array substrate 110 of the array substrate 110 with the gate electrode 121, the gate lines 116 and 116' and the gate pad line 116p formed thereon, and then selectively removed through the photolithography process (a second masking process) to form an active pattern 124 formed of the amorphous silicon thin film at an upper portion of the gate electrode 121 and, at the same time, to form the data line 117 formed of the second conductive film at the data line part.

At this time, a first n+ amorphous silicon thin film pattern 130' and a second conductive film pattern 150', which are formed of the n+ amorphous silicon thin film and the second conductive film and have been patterned in the same form as the active pattern 124, remain on the active pattern 124.

In addition, at lower portions of the data line 117 and the data pad line 117p, there are formed a first amorphous silicon thin film 120' and a second n+ amorphous silicon thin film pattern 130", and a second amorphous silicon thin film pattern 120" and a third n+ amorphous silicon thin film pattern 130'" which are formed of the amorphous silicon thin film and the n+ amorphous silicon thin film and have been patterned in the same form as the data line 117 and the data pad line 117p.

Here, the active pattern 124 is formed as an island over the gate electrode 121 and within boundaries defined by the perimeter of the gate electrode 121 with the first insulation film 115a interposed therebetween. The active pattern 124, the data line 117, and the gate pad part contact hole 140 are formed, through a single masking process (the second masking process), using a single mask, such as half-tone mask or a diffraction (slit) mask (hereinafter, it is assumed that referring to the half-tone mask means it also includes the diffraction mask). The second masking process will now be described in detail as follows.

FIGS. 7A to 7F are cross-cross-sectional views showing a second masking process in detail in FIGS. 5B and 6B.

Figure 7A:
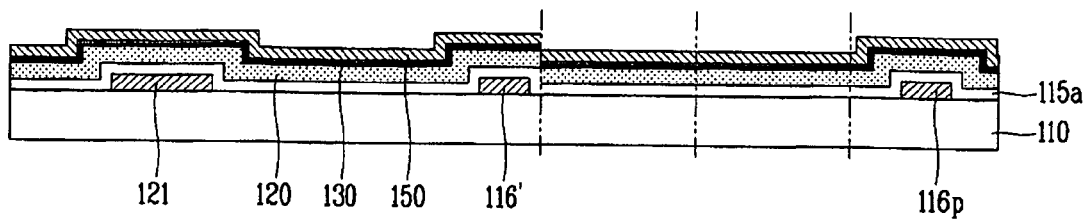
FIGS. 7A to 7F are cross-sectional views substantially showing a second masking process in FIGS. 5B and 6B.

As shown in FIG. 7A, the first insulation film 115a, the amorphous silicon thin film 120, the n+ amorphous silicon thin film 130 and the second conductive film 150 are formed over the entire surface of the array substrate 110 with the gate electrode 121, the gate lines 116 and 116' and the gate pad line 116p formed thereon.

In this case, the second conductive film 150 may be made of a low-resistance opaque conductive material, such as aluminum (Al), an aluminum alloy, tungsten (W), copper (Cu), chromium (Cr) and molybdenum (Mo), or the like, to form the source electrode, the drain electrode, the data line, and the data pad line (to be described).

Figure 7B:
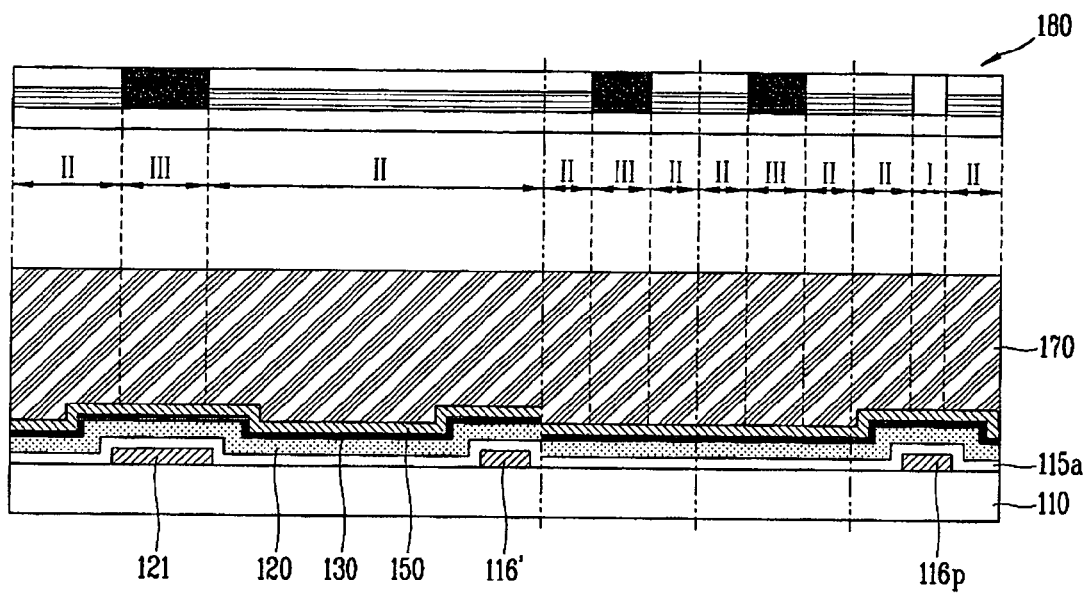

Thereafter, as shown in FIG. 7B, a photosensitive film 170 made of a photosensitive material such as photoresist is formed over the entire surface of the array substrate 110, on which light is selectively irradiated through the half-tone mask 180.

The half-tone mask 180 includes a first transmission region (I) that allows irradiated light to be entirely transmitted therethrough, a second transmission region (II) that allows only light to be partially transmitted therethrough while blocking the remaining light, and a blocking region (III) that entirely blocks the irradiated light. Only light which has transmitted through the half-tone mask 180 can be irradiated onto the photosensitive film 170.

Figure 7C:
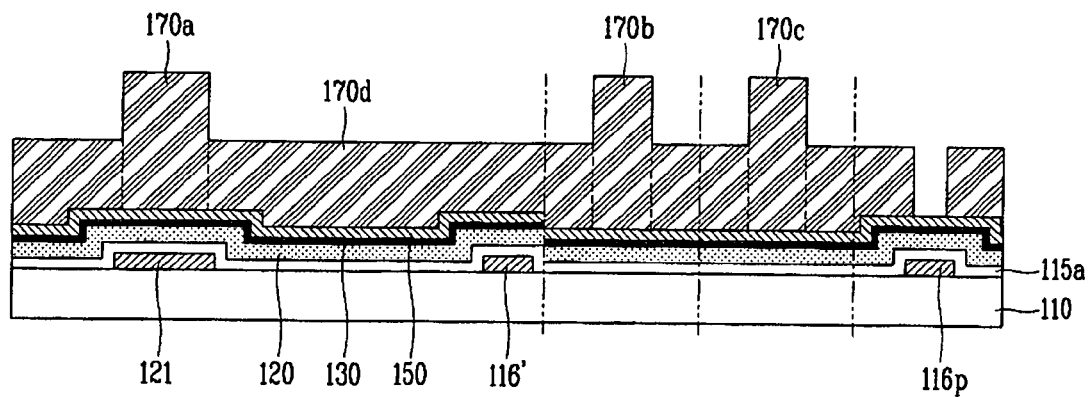

Subsequently, when the photosensitive film 170, which has been exposed through the half-tone mask 180, is developed, as shown in FIG. 7C, first to fourth photosensitive film patterns 170a to 170d each with a certain thickness remain at regions where light has been entirely blocked or partially blocked through the blocking region (III) and the second transmission region (II), and the photosensitive film at the transmission region (I) through which light had been entirely transmitted has been completely removed to expose the surface of the second conductive film 130.

The first to third photosensitive film patterns 170a to 170c formed at the blocking region III are thicker than the fourth photosensitive film pattern 170d formed through the second transmission region II. In addition, the photosensitive film at the region where the light had entirely transmitted through the first transmission region I has been completely removed. This is because positive photoresist has been used. However, a negative photoresist can be also used in embodiments of the present invention.

Figure 7D:
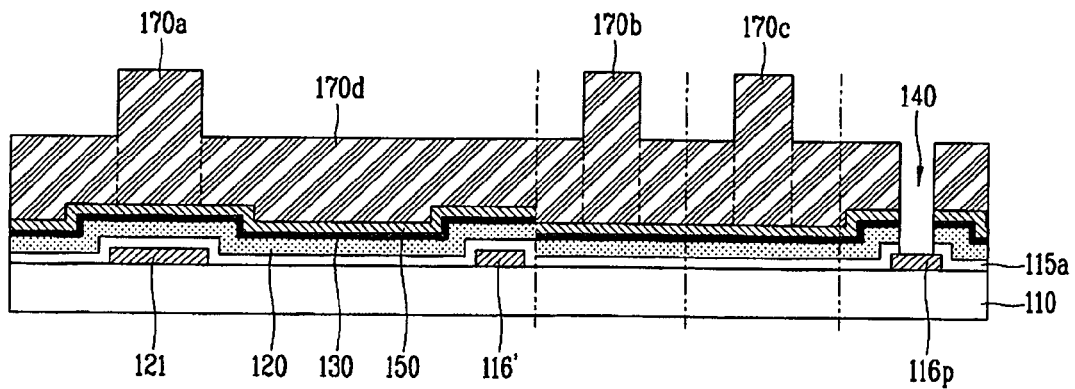

Thereafter, as shown in FIG. 7D, the first insulation film 115a, the amorphous silicon thin film 120, the n+ amorphous silicon thin film 130 and the second conductive film 150 are selectively removed by using the first to fourth photosensitive film patterns 170a to 170d as masks to form the gate pad part contact hole 140 exposing a portion of the gate pad line 116p at the gate pad part of the array substrate 110.

Then, an ashing process is performed to remove portions of the first to fourth photosensitive film patterns 170a to 170d.

Figure 7E:
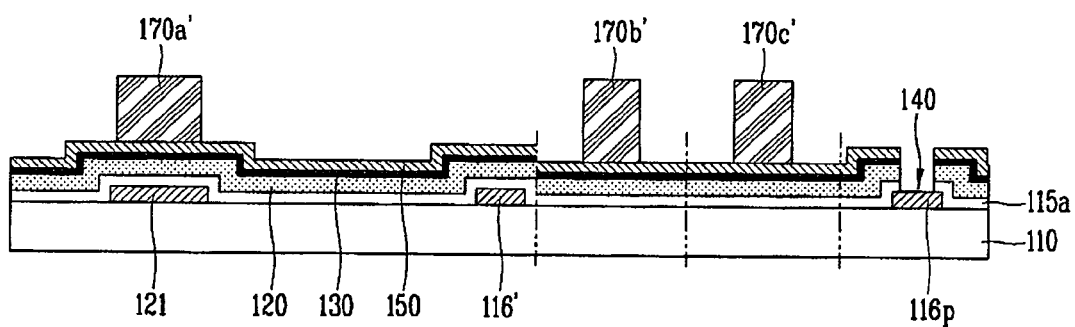

Then, as shown in FIG. 7E, the fourth photosensitive film pattern of the second transmission region II is completely removed. In this case, the first to third photosensitive film patterns remain as fifth to seventh photosensitive film patterns 170a' to 170c' by removing the thickness of the fourth photosensitive film pattern only at the active pattern region, the data line region, and the data pad line region corresponding to the blocking region III.

Figure 7F:
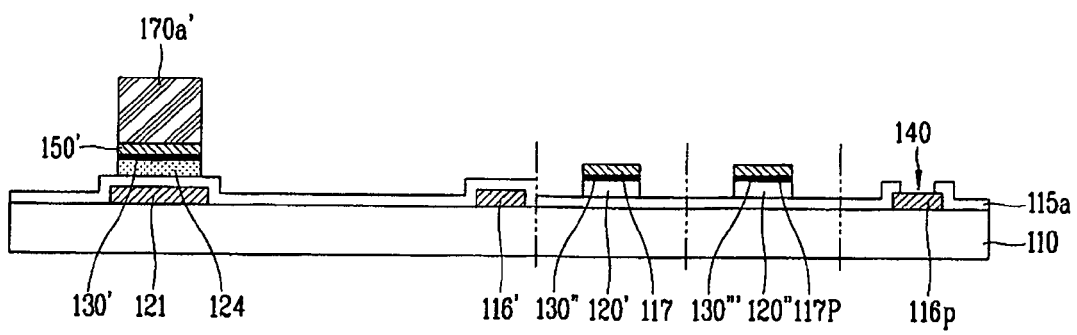

Thereafter, as shown in FIG. 7F, portions of the amorphous silicon thin film, the n+ amorphous silicon thin film and the second conductive film are removed by using the remaining fifth to seventh photosensitive film pattern 170a' to 170c' as masks to form the active pattern 124 as an island formed of the amorphous silicon thin film over the gate electrode 121 and within the boundaries defined by the perimeter of the gate electrode 121 to thus reduce an off current of the TFT.

In addition, portions of the amorphous silicon thin film, the n+ amorphous silicon thin film and the second conductive film are removed by using the fifth to seventh photosensitive film patterns 170a' to 170c' to form the data line and the data pad line 117p formed of the second conductive film at the data line part and the data pad part, respectively.

At this time, a first n+ amorphous silicon thin film pattern 130' and a second conductive film pattern 150', which are formed of the n+ amorphous silicon thin film and the second conductive film and have been patterned in the same form as the active pattern 124, remain at the upper portion of the active pattern 124. Thus, the active pattern 124 is formed as an island over the gate electrode 121 and within boundaries defined by the perimeter of the gate electrode 121 to thus reduce an off current of the TFT.

In addition, the first amorphous silicon thin film pattern 120', the second n+ amorphous silicon thin film pattern 130", and the third amorphous silicon thin film pattern 130'", which are formed of the amorphous silicon thin film and the n+ amorphous silicon thin film and have been patterned in the same form as the data line 117 and the data pad line 117p, are formed at lower portions of the data line 117 and the data pad line 117p.

Because the data line 117 does not have a tail of the active pattern made of the amorphous silicon thin film, there is no signal interference to the data line 117 possibly by the tail and the aperture ratio is not degraded.

Figure 5C:
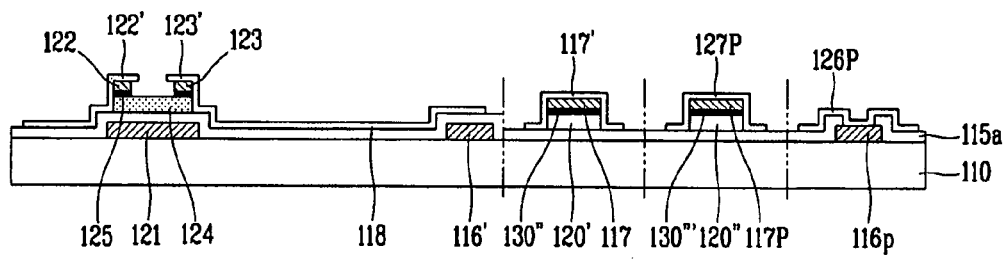

Next, as shown in FIGS. 5C and 6C, a third conductive film is deposited over the entire surface of the array substrate 110 with the active pattern 124 formed thereon, and then portions of the second conductive film pattern and the third conductive film are removed by using the photolithography process (a third masking process) to form the pixel electrode 118 formed of the third conductive film and at the same time to form the source electrode 122 and the drain electrode 123 formed of the fourth conductive film at the pixel part of the array substrate 110.

In addition, through the third masking process, the data pad electrode 127p and the gate pad electrode 126p formed of the third conductive film are formed at the data pad part and the gate pad part of the array substrate 110.

The third conductive film is made of a transparent conductive material with good transmittance such as indium-tin-oxide (ITO) or indium-zinc-oxide (IZO) to form the pixel electrode 118, the data pad electrode 127p and the gate pad electrode 126p.

In this case, at upper portions of the source electrode 122, the drain electrode 123 and the data line formed of the second conductive film, there are formed the source electrode pattern 122', the drain electrode pattern 123' and the data line pattern 117' which are formed of the third conductive film and have been patterned to have a width larger than the source electrode 122, the drain electrode 123 and the data line 117.

In the first embodiment of the present invention, the source electrode 122 and the drain electrode 123 are formed as islands over the gate electrode 121 and within boundaries of the gate electrode 121 defined by the perimeter of the gate electrode 121. The source electrode 122 is electrically connected with the data line 117 via the source electrode pattern 122' and the drain electrode 123 is electrically connected with the pixel electrode 118 via the drain electrode pattern 123'.

The source electrode 122, the drain electrode 123 and the data line 117 are completely covered by the source electrode pattern 122', the drain electrode pattern 123' and the data line pattern 117' formed thereon.

A certain region of the first n+ amorphous silicon thin film pattern formed on the active pattern 124 is removed through the third masking process to form the ohmic-contact layer 125.

At this time, the gate pad electrode 126p is electrically connected with the lower gate pad line 116p via the gate pad part contact hole, and the data pad electrode 127p contacts and is electrically connected with the lower data pad line 117p.

A portion of the corresponding pixel electrode 118 is formed to overlap with a portion of the previous gate line 116' to form the storage capacitor Cst together with the previous gate line 116' with the first insulation film 115a interposed therebetween.

Figure 5D:
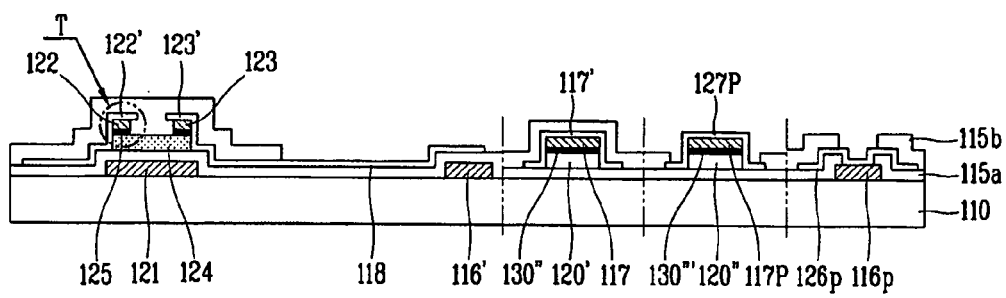

As shown in FIGS. 5D and 6C, the second insulation film 115b is formed over the entire surface of the array substrate 110 and then selectively removed by using the photolithography process (a fourth masking process) to open the pixel region and the pad part.

In this manner, in the first embodiment of the present invention, the array substrate 110 including the TFTs can be fabricated through a total of four masking processes. That is, as mentioned above, the active pattern 124 and the data line 117 are formed using the half-tone mask through the single masking process, and the source electrode 122, the drain electrode 123, and the pixel electrode 118 are formed through the single masking process by using the two-metal stacked structure.

The two-metal stacked structure is a technique in which two conductive films are stacked and wet-etched twice to form source and drain electrodes 122 and 123 and the pixel electrode 118, each being formed of a different conductive film. As shown in FIG. 5D, in general, after the first wet etching is performed, when the second wet etching is performed, an undercut is generated or a reverse taper (T) is formed. This will now be described in detail with reference to the accompanying drawings.

FIGS. 8A to 8D are cross-sectional views sequentially showing the etching process in the two-metal stacked structure according to a first embodiment of the present invention.

Figure 8A:
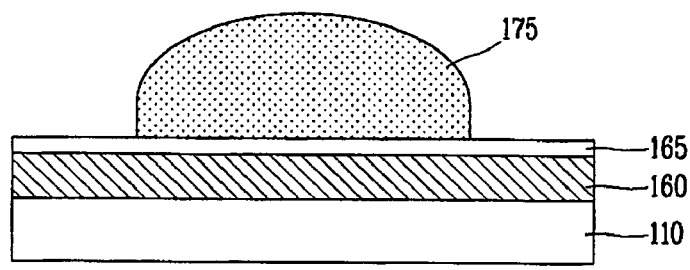
FIGS. 8A to 8D are cross-sectional views sequentially showing an etching process in the two-metal stacked structure according to a first embodiment of the present invention.

As shown in FIG. 8A, a first conductive film 160 and a second conductive film 165 are stacked on the array substrate 110, and a certain photosensitive film pattern 175 made of a photosensitive film such as photoresist is then formed.

In this case, the first conductive film 160 may be made of a low resistance opaque conductive material such as aluminum, an aluminum alloy, tungsten, copper, chromium, molybdenum, etc, in order to form source and drain electrode. The second conductive film 165 may be made of a transparent conductive material having good transmittance such as indium tin oxide (ITO) or indium zinc oxide to form the pixel electrode, the source electrode pattern and the drain electrode pattern.

Figure 8B:
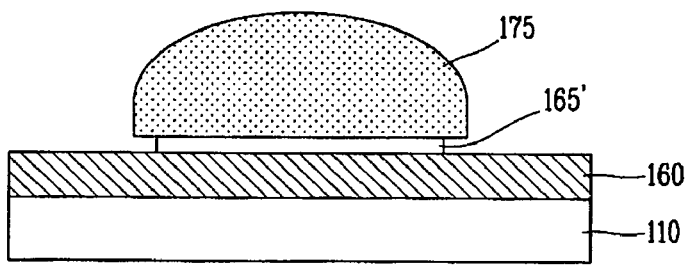

Thereafter, as shown in FIG. 8B, the second conductive film 165 formed is selectively removed by using the photosensitive film pattern 175 as a mask (first wet etching) to form a second conductive film pattern 165' formed of the second conductive film on the array substrate 110.

In this case, side portions of the second conductive film pattern 165' are over-etched through the first wet etching to have a width smaller than that of the photosensitive film pattern 175.

Figure 8C:
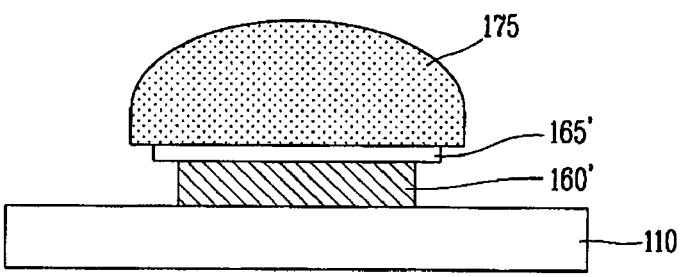
Figure 8D:
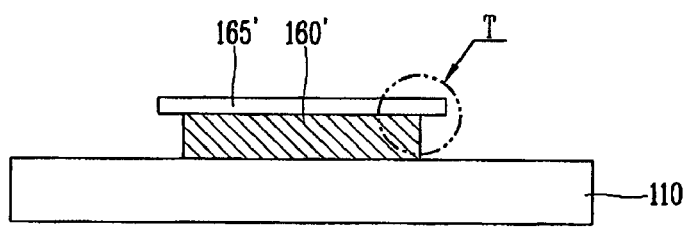

After performing the first wet etching, as shown in FIG. 8C, the lower first conductive film is selectively removed (second wet etching) to form a first conductive film pattern 160' which is formed of the first conductive film and has a width smaller than that of the second conductive film pattern 165".

In this manner, as the wet etching is performed on the two metals twice, the first conductive film pattern 160' formed of the first conductive film and the second conductive film pattern 165' formed of the second conductive film are formed to have a stacked structure.

In this case, because the first conductive film pattern 160' is etched to have the width smaller than that of the second conductive film pattern 165', the side of the first conductive film pattern 160' and the second conductive film pattern 165' has a reverse taper (T) shape.

When applying this structure to the first embodiment of the present invention, as shown in FIG. 5D, the first conductive film pattern 160' may correspond to the source electrode 122 and the drain electrode 123, and the second conductive film pattern 165' may correspond to the source electrode pattern 122' and the drain electrode pattern 123'.

In order to improve this structure, the photosensitive film pattern is collapsed through a baking process after the first wet etching to cover the upper conductive film pattern, and then, the second wet etching is performed to thus prevent the occurrence of the above-mentioned undercut phenomenon and form a forward taper shape. This will now be described in detail through a second embodiment of the present invention.

FIGS. 9A to 9E are cross-sectional views sequentially showing an etching process in the two-metal stacked structure according to a second embodiment of the present invention.

Figure 9A:
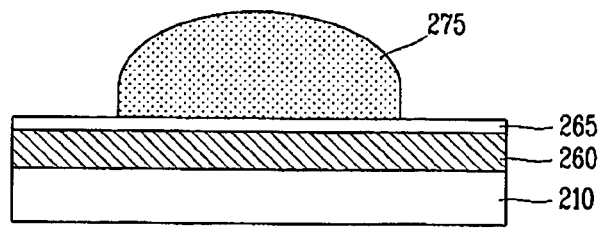
FIGS. 9A to 9E are cross-sectional views sequentially showing an etching process in the two-metal stacked structure according to a second embodiment of the present invention.

As shown in FIG. 9A, a first conductive film 260 and a second conductive film 265 are stacked on an array substrate 210, and then, a first photosensitive film pattern 275 made of a photosensitive material such as photoresist is formed thereon.

Figure 9B:
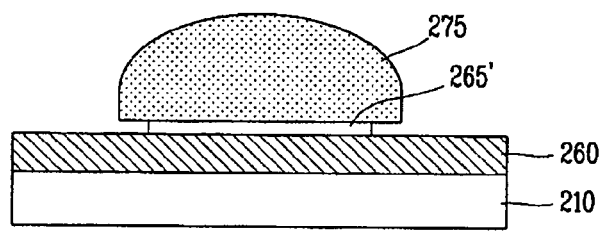

Thereafter, as shown in FIG. 9B, the lower second conductive film is selectively removed by using the first photosensitive film pattern 275 as a mask (a first wet etching) to form a second conductive film pattern 265' formed of the second conductive film on the array substrate 210.

In this case, portions of the side of the second conductive film pattern 265' have been over-etched through the first wet etching, so the second conductive film pattern 265' has a width smaller than the photosensitive film pattern 275.

Figure 9C:
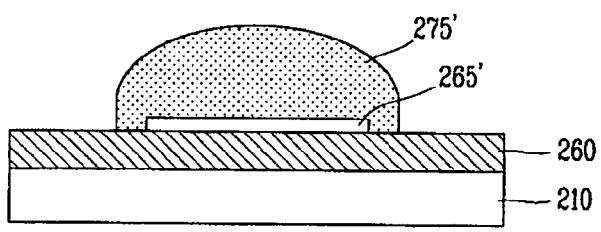
Figure 9D:
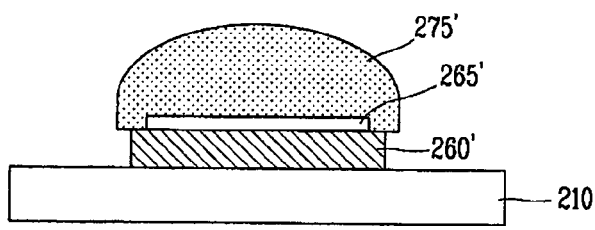
Figure 9E:
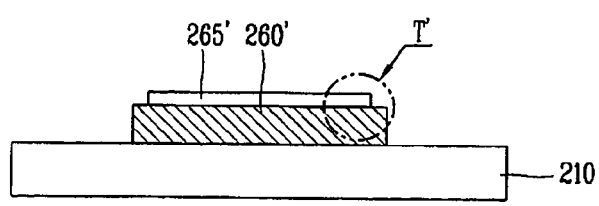

After the first wet etching is finished, a baking process is performed at a temperature of about 130° C. to 160° C. Then, as shown in FIG. 9C, the first photosensitive film pattern collapses to form a second photosensitive film pattern 275' having such a form to cover the second conductive film pattern 265'.

Consequently, the lower first conductive film 260 is selectively removed by using the second photosensitive film pattern 275' as a mask (second wet etching) to form a first conductive film pattern 260' which is formed of the first conductive film and has a width smaller than the second photosensitive film pattern 275' but has a width larger than the second conductive film pattern 265'.

In this manner, because the first conductive film pattern 260' according to the second embodiment of the present invention is patterned to have the width larger than the second conductive film pattern 265', the sides of the first and second conductive film patterns 260' and 265' have a forward taper shape (T').

The LCD and its fabrication method according to the second embodiment of the present invention will now be described in detail.

Figure 10:
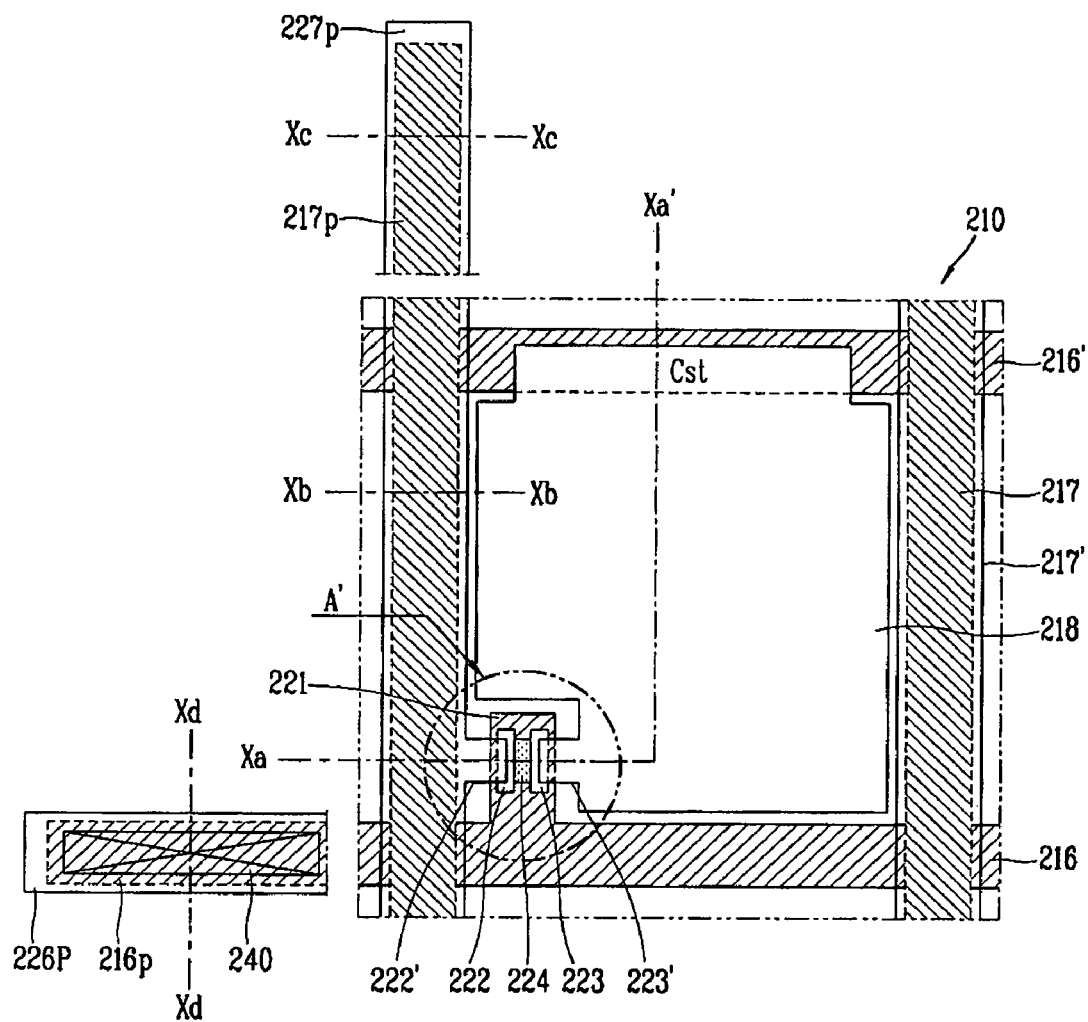
FIG. 10 is a plan view schematically showing a portion of an array substrate of an LCD according to a second embodiment of the present invention.

FIG. 10 is a plan view schematically showing a portion of an array substrate of an LCD according to the second embodiment of the present invention, which has the same configuration as the array substrate of the LCD according to the first embodiment of the present invention except that the source and drain electrode and the source and drain electrode patterns have the forward taper shape in the two-metal stacked structure.

Figure 11:
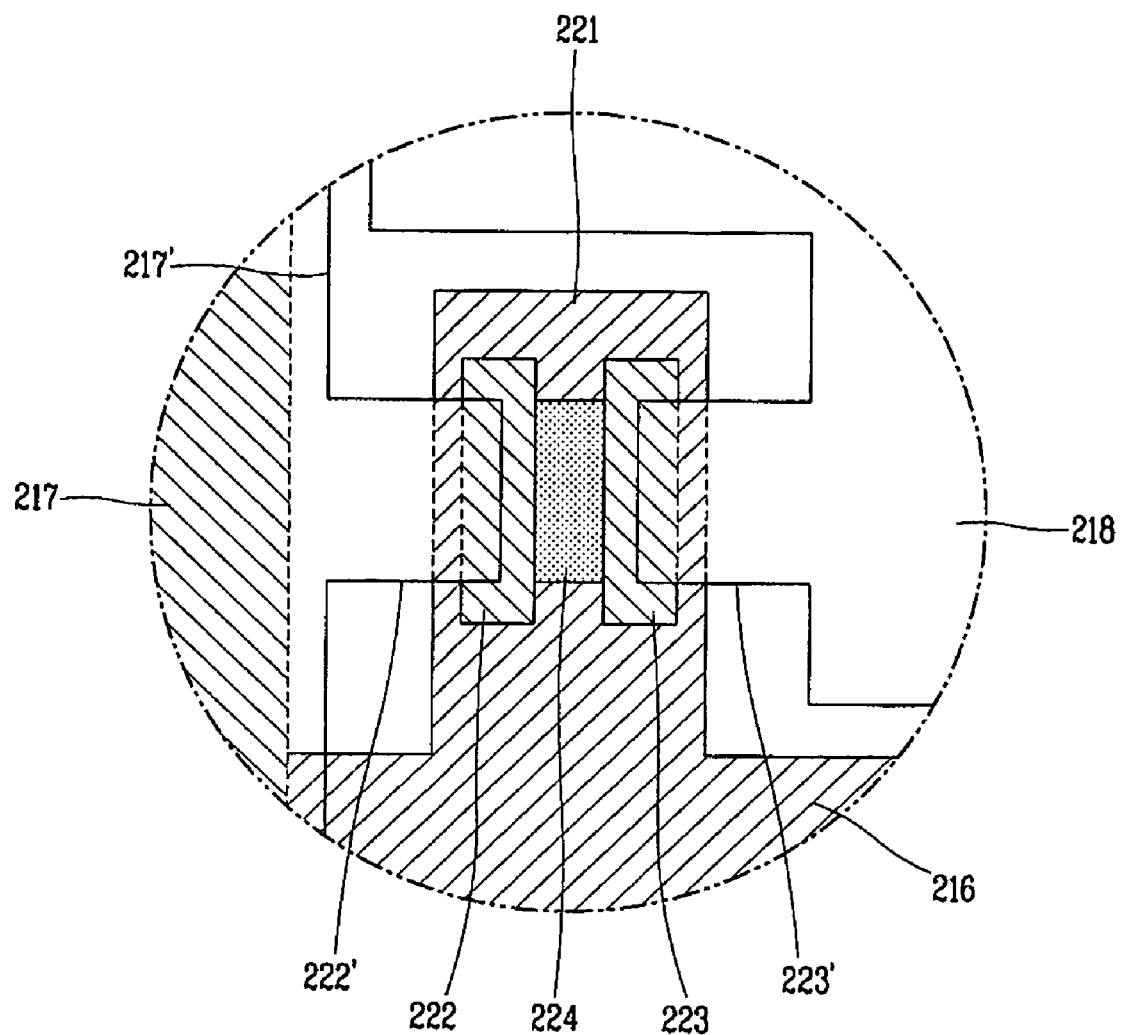
FIG. 11 is a view illustrating an enlarged portion 'A' of the array substrate in FIG. 10.

FIG. 11 is a view illustrating an enlarged portion 'A' of the array substrate in FIG. 10.

As shown in FIGS. 10 and 11, gate lines 216 and the data lines 217 are formed to be arranged vertically and horizontally to define the pixel region on an array substrate 210. A thin film transistor (TFT), a switching element, is formed at a crossing of the gate line 216 and the data line 217. A pixel electrode 218 is formed within the pixel region, is connected with the TFT to drive liquid crystal (not shown) together with a common electrode of a color filter substrate (not shown).

A gate pad electrode 226p and a data pad electrode 227p are formed at edge portions of the array substrate 210 and electrically connected with the gate line 216 and the data line 217, and transfer a scan signal and a data signal applied from an external driving circuit unit (not shown) to the gate line 216 and the data line 217, respectively.

Namely, the gate line 216 and the data line 217 extend to the driving circuit unit so as to be connected with the corresponding gate pad line 216p and the data pad line 217p, and the gate pad line 216p and the data pad line 217p receive the scan signal and the data signal from a driving circuit unit through the gate pad electrode 226p and the data pad electrode 227p electrically connected with the gate pad line 216p and the data pad line 217p.

The gate pad electrode 226p is electrically connected with the gate pad line 216p via the gate pad part contact hole 240. A portion of the previous gate line 216 overlaps with an upper pixel electrode 218 with a first insulation film (not shown) interposed therebetween to form a storage capacitor (Cst).

The TFT includes a gate electrode 221 connected with the gate line 216, a source electrode 222 connected with the data line 217, and a drain electrode 223 connected with the pixel electrode 218. The TFT also includes an active pattern 224 for forming a conductive channel between the source and drain electrodes 222 and 223 by a gate voltage supplied to the gate electrode 221.

The active pattern 224 is formed of an amorphous silicon thin film as an island over the gate electrode 221 and within the boundaries defined by the perimeter of the gate electrode 221 to thus reduce an off current of the TFT.

At upper portions of the source electrode 222, the drain electrode 223 and the data line 217 made of an opaque conductive material, there are formed a source electrode pattern 222', a drain electrode pattern 223' and a data line pattern 217'.

In the second embodiment of the present invention, the source electrode 222 and the drain electrode 223 are formed as islands over the gate electrode 221 and within boundaries defined by the perimeter of the gate electrode 221. In this case, the source electrode is electrically connected with the source electrode pattern 222' and the drain electrode 223 is electrically connected with the pixel electrode 218 via the drain electrode pattern 223'.

Some portions of the source electrode 222 and the drain electrode 223 are covered by the source electrode pattern 222' and the drain electrode pattern 223' and other portions thereof are exposed.

Namely, likewise as in the first embodiment of the present invention, the source and drain electrodes 222 and 223 and the source and drain electrode patterns 222' and 223' according to the second embodiment of the present invention have the two-metal stacked structure, but unlike those in the first embodiment of the present invention, the source and drain electrode patterns 222' and 223', the lower conductive film patterns, are etched to have the width larger than the source and drain electrodes 222 and 223 to form the forward taper shape in their side configuration. This will now be described through the following fabrication method of the LCD.

FIGS. 12A to 12D are cross-sectional views sequentially showing a fabrication process taken along lines Xa-Xa', Xb-Xb, Xc-Xc and Xd-Xd of the array substrate in FIG. 10.

The left side shows the process of fabricating the array substrate of the pixel part and the right side shows the sequential process of fabricating the array substrate of the data pad part and the gate pad part.

Figure 12A:
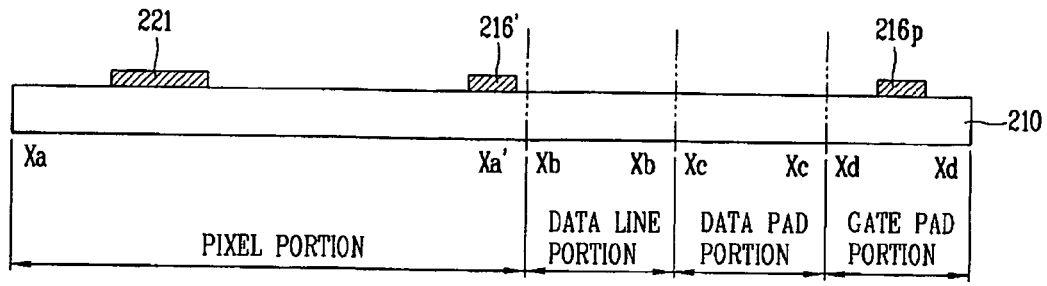
FIGS. 12A to 12D are cross-sectional views sequentially showing a fabrication process taken along lines Xa-Xa', Xb-Xb, Xc-Xc and Xd-Xd of the array substrate in FIG. 10.

As shown in FIG. 12A, the gate electrode 221 and the gate lines 216' on the pixel part of the array substrate 210 made of the transparent insulation material such as glass, and the gate pad line 216p is formed on the gate pad part of the array substrate 210.

Reference numeral 216' refers to the previous gate line with respect to a corresponding pixel, and a gate line (not shown) of the corresponding pixel and the previous gate line 216' are formed in the same manner.

In this case, the gate electrode 221, the gate line 216' and the gate pad line 216p are formed by depositing a first conductive film over the entire surface of the array substrate 210 and selectively patterning it through the photolithography process (a first masking process).

Here, the first conductive film may be made of a low-resistance opaque conductive material such as aluminum, an aluminum alloy, tungsten, copper, chromium, molybdenum, etc. In addition, the first conductive film may have a multi-layered structure including two or more low-resistance conductive materials.

Figure 12B:
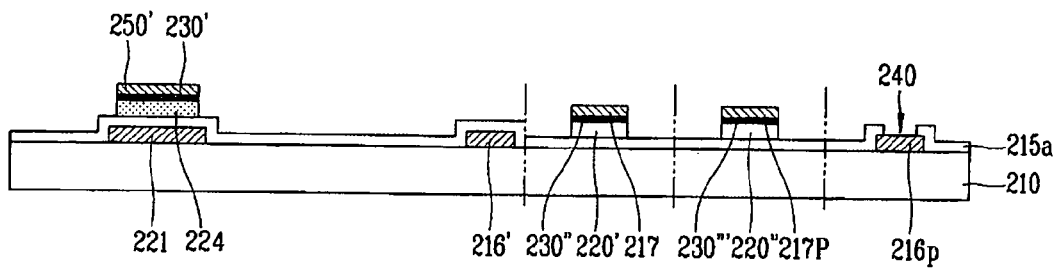

Next, as shown in FIG. 12B, a first insulation film 215a, an amorphous silicon thin film, an n+ amorphous silicon thin film and a second conductive film are formed over the entire surface of the array substrate 210 of the array substrate 210 with the gate electrode 221, the gate line 216' and the gate pad line 216p formed thereon, and then selectively removed through the photolithography process (a second masking process) to form an active pattern 224 formed of the amorphous silicon thin film at an upper portion of the gate electrode 221 and form a data line 217 formed of the second conductive film at the data line part.

Then, a first n+ amorphous silicon thin film pattern 230' and a second conductive film pattern 250', which are formed of the n+ amorphous silicon thin film and the second conductive film and have been patterned in the same form as the active pattern 224, remain on the active pattern 224.

Also, a first amorphous silicon thin film pattern 220', a second n+ amorphous silicon thin film pattern 230'', a second amorphous silicon thin film pattern 220'', and a third n+ amorphous silicon thin film pattern 230''', which are formed of the amorphous silicon thin film and the n+ amorphous silicon thin film and have been patterned in the same form as the data line 217 and the data pad line 217p, are formed at lower portions of the data line 217 and the data pad line 217p.

Here, the active pattern 224 according to the second embodiment of the present invention is formed as an island over the gate electrode 221 and within the boundaries defined by the perimeter of the gate electrode 221, with the first insulation film 215a interposed therebetween, to thus reduce an off current of the TFT.

In addition, the active pattern 224, the data line 217, and the gate pad part contact hole 240 can be simultaneously formed by using a single masking process (the second masking process) with the half-tone mask.

In addition, because there is no tail (portion or region) of the active pattern made of the amorphous silicon thin film at the lower portion of the data line 217 according to the second embodiment of the present invention, signal interference of the data line 217 caused by the tail of the active pattern does not occur and the aperture ratio is not degraded.

Here, the second conductive film may be made of the low-resistance opaque conductive material such as aluminum, an aluminum alloy, tungsten, copper, chromium, molybdenum, etc., to form the source electrode, the drain electrode, the data line, and the data pad line (to be described).

Figure 12C:
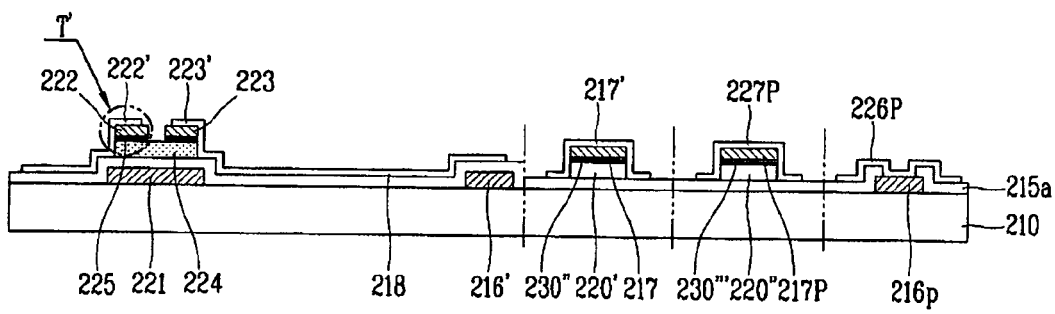

Next, as shown in FIG. 12C, a third conductive film is deposited over the entire surface of the array substrate 210 with the active pattern 224 formed thereon, and then portions of the second conductive film pattern and the third conductive film are removed by using the photolithography process (a third masking process) to form the pixel electrode 218 formed of the third conductive film and at the same time to form the source electrode 222 and the drain electrode 223 at the pixel part of the array substrate 210.

In addition, through the third masking process, the data pad electrode 227p and the gate pad electrode 226p formed of the third conductive film are formed at the data pad part and the gate pad part of the array substrate 210.

Here, the third conductive film may be made of a transparent conductive film having good transmittance such as ITO or IZO to form the pixel electrode 218, the data pad electrode 227p and the gate pad electrode 226p. In this case, at the upper portions of the source electrode 222, the drain electrode 223 and the data line 217 formed of the second conductive film, there are formed a source electrode pattern 222', a drain electrode pattern 223' and a data line pattern 217' formed of the third conductive film.

The source electrode 222 and the drain electrode 223 according to the second embodiment of the present invention are formed as islands over the gate electrodes 221 and within boundaries defined by the perimeter of the gate electrode 221, and in this case, the source electrode 222 is electrically connected with the data line 217 via the source electrode pattern 222', and the drain electrode 223 is electrically connected with the pixel electrode 218 via the drain electrode pattern 223'.

A certain region of the first n+ amorphous silicon thin film pattern formed on the active pattern 224 is removed through the third masking process to form an ohmic-contact layer 225 that allows the active pattern 224 and the source and drain electrodes 222 and 223 to ohmic-contact with each other.

In this case, the gate pad electrode 226p is electrically connected with the lower gate pad line 216p via the gate pad part contact hole, and the data pad electrode 227p contacts and electrically connected with the lower data pad line 217p.

A portion of the corresponding pixel electrode 218 overlaps with a portion of the previous gate line 216' to form a storage capacitor Cst together with the previous gate line 216' with the first insulation film 215a interposed therebetween.

Herein, in the second embodiment of the present invention, the source and drain electrodes 222 and 223 and the source and drain electrode patterns 222' and 223' are formed by using the etching process as described above to have the forward taper shape (T') in their side configuration.

Namely, the lower source electrode 222 and the drain electrode 223 are patterned to be protruded compared with the upper source electrode pattern 222' and the drain electrode pattern 223', allowing their sides to have the forward taper shape without causing an undercut phenomenon.

Figure 12D:
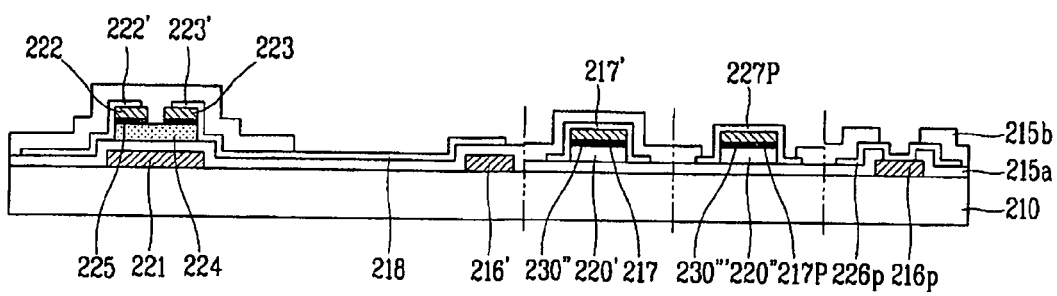

As shown in FIG. 12D, the second insulation film 215b is formed over the entire surface of the array substrate 210 and then selectively removed by using the photolithography process (a fourth masking process) to open the pixel region and the pad part. In this case, in the second embodiment of the present invention, the occurrence of an undercut or the reverse taper that may be generated when the two-metal stacked structure is applied can be prevented, so a defective rate can be reduced in the follow-up thin film depositing process, namely, in the process of depositing the second insulation film 215b.

The array substrates according to the first and second exemplary embodiments of the present invention are attached with color filter substrates in a facing manner by a sealant applied to outer edges of the image display part. In this case, the color filter substrates include black matrixes for preventing leakage of light to the TFTs, the gate lines and the data lines and color filters for implementing red, green and blue colors.

The attachment of the color filter substrates and the array substrates are made through attachment keys formed on the color filter substrates or the array substrates.

In the first and second embodiments of the present invention, as the active patterns, the amorphous silicon TFT using the amorphous silicon thin film is used as an example, but the present invention is not limited thereto and as the active patterns, polycrystalline silicon TFTs using a polycrystalline silicon thin film can be also used.

The present invention can be also applied to a different display device fabricated by using TFTs, for example, an OLED (Organic Light Emitting Diode) display device in which OLEDs are connected with driving transistors.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A method for fabricating a liquid crystal display device, comprising:
providing a first substrate divided into a pixel part and first and second pad parts;
forming a gate electrode and a gate line at the pixel part of the first substrate;
forming an active pattern as an island to have narrower width than that of the gate electrode over the gate electrode;
forming a data line crossing the gate line with a first insulation film therebetween to define a pixel region at the pixel part of the first substrate;
forming source and drain electrodes made of an opaque conductive material at the pixel part of the first substrate;
forming source and drain electrode patterns made of a transparent conductive material to cover some upper portions of the source and drain electrodes, respectively, and forming a pixel electrode made of the transparent conductive material through one masking process,
wherein other upper portions of the source and drain electrodes are exposed and
wherein the drain electrode is electrically connected with the pixel electrode via the drain electrode pattern;
forming a second insulation film to cover the exposed upper portions of the source and drain electrodes, and to cover the source and drain electrode patterns except for the pixel electrode on the first substrate; and
attaching the first substrate and a second substrate.

2. The method of claim 1, further comprising:
forming a gate pad line at the first pad part of the first substrate, the gate pad line being formed of a first conductive film that forms the gate electrode.

3. The method of claim 2, wherein the forming of the active pattern and the data line comprises:
forming the first insulation film, an amorphous silicon thin film, an n+ amorphous silicon thin film, and a second conductive film on the first substrate; and
selectively removing the amorphous silicon thin film, the n+ amorphous silicon thin film and the second conductive film to form the active pattern as an island over the gate electrode, and forming the data line crossing the gate line to define the pixel region at the pixel part of the first substrate.

4. The method of claim 3, further comprising:
selectively removing the amorphous silicon thin film, the n+ amorphous silicon thin film and the second conductive film to form an n+ amorphous silicon thin film pattern and a second conductive film pattern, which are formed of the n+ amorphous silicon thin film and the second conductive film, on the active pattern.

5. The method of claim 4, wherein the n+ amorphous silicon thin film pattern and the second conductive film pattern are formed in the same form as the active pattern.

6. The method of claim 4, wherein the forming of the source electrode, the drain electrode and the pixel electrode comprises:
forming a third conductive film on the first substrate;
forming a first photosensitive film pattern, which is formed of photoresist, on the first substrate with the third conductive film formed thereon;
selectively removing the third conductive film by using the first photosensitive film pattern as a mask to form a source electrode pattern and a drain electrode pattern which are formed of the third conductive film, and a pixel electrode, which is formed of the third conductive film;
collapsing the first photosensitive film pattern through a baking process to form a second photosensitive film pattern that covers the source electrode pattern and the drain electrode pattern; and
selectively removing the second conductive film pattern by using the second photosensitive film pattern as a mask to form a source electrode and a drain electrode, which are formed of the second conductive film, at an upper portion of the gate electrode.

7. The method of claim 6, wherein the third conductive film and the second conductive film pattern are selectively removed through wet etching.

8. The method of claim 6, wherein the baking process is performed at a temperature within the range of about 130° C. to 160° C.

9. The method of claim 3, wherein the active pattern is formed of the amorphous silicon thin film, and the data line is formed of the second conductive film.

10. The method of claim 3, further comprising:
forming a data pad line, which is formed of the second conductive film, at the second pad part of the first substrate.

11. The method of claim 10, further comprising:
a data pad electrode electrically connected with the data pad line at the second pad part of the first substrate.

12. The method of claim 3, further comprising:
removing portions of the n+ amorphous silicon thin film pattern and the second conductive film pattern to expose a portion of the active pattern.

13. The method of claim 12, wherein a portion of the n+ amorphous silicon thin film pattern is removed to form an ohmic-contact layer.

14. The method of claim 2, further comprising:
removing the first insulation film to form a contact hole exposing a portion of the gate pad line.

15. The method of claim 1, wherein the source electrode is electrically connected with the data line via the source electrode pattern.

16. The method of claim 1, wherein the source and drain electrodes are formed as islands at the upper portion of the gate electrode.

17. The method of claim 14, further comprising:
forming a gate pad electrode electrically connected with the gate pad line via the contact hole.

* * * * *